(12) United States Patent
Sawyer et al.

(10) Patent No.: US 7,382,210 B2
(45) Date of Patent: Jun. 3, 2008

(54) BROADBAND DIFFERENTIAL COUPLING CIRCUIT HAVING COUPLED DIFFERENTIAL AGGRESSOR AND SIGNAL CHANNELS

(75) Inventors: T. Shannon Sawyer, Fort Collins, CO (US); Minh V. Quach, Ft. Collins, CO (US)

(73) Assignee: Avago Technologies General IP Pte. Ltd, Singapore (SG)

( * ) Notice: Subject to any disclaimer, the term of this patent is extended or adjusted under 35 U.S.C. 154(b) by 139 days.

(21) Appl. No.: 11/238,339

(22) Filed: Sep. 29, 2005

(65) Prior Publication Data

US 2007/0083339 A1   Apr. 12, 2007

(51) Int. Cl.
*H01P 3/04*   (2006.01)

(52) U.S. Cl. ............................................. 333/5; 333/12
(58) Field of Classification Search .................... 333/1, 333/4, 5, 12
See application file for complete search history.

(56) References Cited

U.S. PATENT DOCUMENTS

| | | | |
|---|---|---|---|
| 4,766,401 A | * | 8/1988 | Kjosness et al. ............... 333/12 |
| 5,708,400 A | * | 1/1998 | Morris ......................... 333/12 |
| 6,107,578 A | * | 8/2000 | Hashim ....................... 174/250 |
| 6,381,269 B1 | | 4/2002 | Gradl et al. |

* cited by examiner

*Primary Examiner*—Benny Lee

(57) ABSTRACT

Disclosed are various devices, systems and methods for testing broadband differential coupling circuits that are capable of measuring the amount of extraneous interference and noise in such circuits. In preferred embodiments, NEXT and FEXT crosstalk performance characteristics of differential coupling circuits are provided.

9 Claims, 6 Drawing Sheets

BROADBAND DIFFERENTIAL COUPLING CIRCUIT HAVING COUPLED DIFFERENTIAL AGGRESSOR AND SIGNAL CHANNELS

FIELD OF THE INVENTION

This invention relates to the field of broadband differential coupling circuits, and more particularly to devices, systems and methods for measuring the amount of extraneous interference and noise in such circuits.

BACKGROUND

As electronic devices become ever smaller, the importance of inductively- and capacitively-induced crosstalk or noise becomes more significant. This has proven especially true in respect of integrated circuit- or chip-based differential signal electronic circuits (where signals transmitted and received by one or more chips in such circuits are typically 180 degrees out of phase respecting one another).

The severity of inductively- and/or capacitively-induced crosstalk noise in differential signal circuits depends upon a number of different factors, including the number and type of physical interconnects in the circuit, the number and type of integrated circuits or chips incorporated into such circuits, the physical proximities of electrical conductors to electromagnetic noise sources, the numbers, configurations and types of electrical conductors employed in a given printed circuit board (PCB) design. If the impact of crosstalk noise is not taken into account when a differential signal electronic circuit is designed, the circuit may fail when employed in actual practice.

In view of the foregoing difficulties, it is desirable to measure the amount and character of inductively- and/or capacitively-induced crosstalk noise in differential signal electronic circuits under varying broadband noise coupling conditions.

Several different methods and devices are currently employed to effect such measurements, including: (1) power splitter test networks such as the Agilent Part No. 11667B; (2) pick-off T circuits such as those manufactured by Picosecond Pulse Labs in Boulder, Colo.; and (3) directional coupler circuits.

The foregoing methods and devices suffer from various shortcomings, however. While the Agilent Power Splitter Part No. 11667B may be employed to combine an aggressor signal with a victim signal, losses of 6 dB result. Additionally, Agilent Power Splitter Part No. 11667B is not tailored for use in differential signal circuits. Power splitter and resistor network circuits also consume significant amounts of power and cause victim and aggressor signal attenuation. Resistor networks require considerable aggressor signal attenuation so as to provide low loss victim paths.

Various embodiments of pick-off T circuits may suffer from mismatched impedances, variations in frequency response and unwanted reflections of aggressor signals.

Directional couplers can be very expensive; Agilent's Part No. 87301D costs around $1,900 each.

What is needed are methods and devices for the measurement of inductively- and/or capacitively-induced crosstalk noise in differential signal electronic circuits that are broadband, inexpensive, consume little power, and that do not significantly alter or affect the fidelity of the signals being measured and evaluated.

SUMMARY OF THE INVENTION

In accordance with one aspect of the present invention, a non-transformer circuit for injecting at least one broadband aggressor signal through inductive- or capacitive-coupling means into at least first and second thru broadband differential signal channels comprising first and second pairs of conductors is provided. The circuit preferably comprises: (a) a first aggressor channel comprising a third pair of conductors, at least portions of the first aggressor channel being positioned sufficiently close to at least portions of the first thru differential signal channel to cause inductively- or capacitively-coupled crosstalk signals to be induced therein when the at least one aggressor signal is injected in the first aggressor channel; and (b) a second aggressor channel comprising a fourth pair of conductors, at least portions of the second aggressor channel being positioned sufficiently close to at least portions of the second thru differential signal channel to cause inductively- or capacitively-coupled crosstalk signals to be induced therein when the at least one aggressor signal is injected in the second aggressor channel.

In a preferred embodiment of the present invention, the circuit is disposed on a Printed Circuit Board (PCB), at least portions of the first aggressor channel and the first thru differential signal channel are separated by a distance that permits the acquisition of NEXT (or "near-end cross-talk") data from the first thru differential signal channel, and at least portions of the second aggressor channel and the second thru differential signal channel are separated by a distance that permits the acquisition of FEXT (or "far-end cross-talks") data from the second thru differential signal channel. Depending upon the particular requirements at hand, the distances between such channels may range between about 0.002 inches and about 0.020 inches, between about 0.004 inches and about 0.016 inches, between about 0.006 inches and about 0.014 inches, and between about 0.008 inches and about 0.012 inches. Additionally, the first aggressor channel and the first thru differential channel, or the second aggressor channel and the second thru channel, may be disposed substantially parallel to one another over lengths ranging between about 0.100 inches and about 0.500 inches.

The present invention further includes within its scope a method of testing a broadband differentially-coupled circuit for crosstalk, where the circuit comprises at least first and second thru broadband differential signal channels comprising first and second pairs of conductors, respectively, the method comprising providing a first aggressor channel comprising a third pair of conductors, at least portions of the first aggressor channel being positioned sufficiently close to at least portions of the first thru differential signal channel to cause non-transformer-generated inductively- or capacitively-coupled crosstalk signals to be induced therein when an at least one aggressor signal is injected in the first aggressor channel; providing a second aggressor channel comprising a fourth pair of conductors, at least portions of the second aggressor channel being positioned sufficiently close to at least portions of the second thru differential signal channel to cause non-transformer-generated inductively- or capacitively-coupled crosstalk signals to be induced therein when the at least one aggressor signal is injected in the second aggressor channel; (c) injecting the at least one aggressor signal in at least one of the first aggressor channel and the second aggressor channel; and (d) determining the amount of crosstalk in a measured signal provided by at least one of the first thru differential signal channel and the second thru differential signal channel.

BRIEF DESCRIPTIONS OF THE DRAWINGS

The foregoing and other aspects of the invention will become apparent after having read the detailed description of a preferred embodiment of the invention set forth below and after having referred to the following drawings, in which like reference numerals refer to like parts:

DETAILED DESCRIPTION OF A PREFERRED EMBODIMENT

As employed in the specification and claims hereof, the term "NEXT" means "near-end cross-talk," while the term "FEXT" means "far-end cross-talk."

Figure 1:
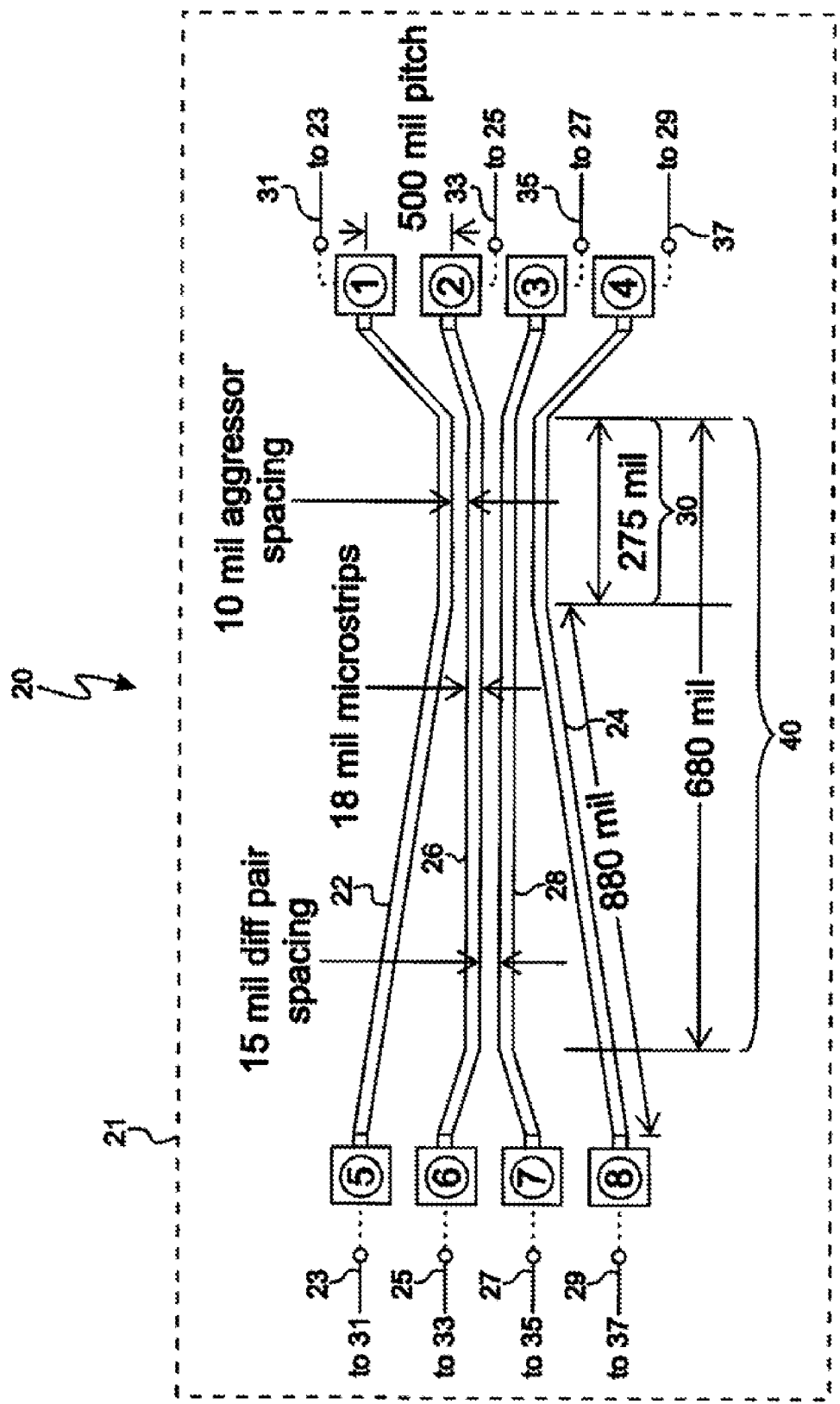
FIG. 1 shows one embodiment of a test circuit of the present invention.

FIG. 1 shows one embodiment of test circuit 20 of the present invention. Test circuit 20 comprises four microstrips 22, 24, 26 and 28, which in a preferred embodiment of the present invention comprise copper and are disposed on a printed circuit board (PCB) substrate by means of etching techniques well known to those skilled in the art.

Inner conductors 26 and 28 represent portions of first and second thru broadband differential signal channels comprising first and second pairs of conductors, respectively. Conductors 26 and 28 carry differential victim signals that are 180 degrees out of phase with respect to one another. Each of conductors 26 and 28 represents one half of the aforementioned conductor pairs because each of conductors 26 and 28 is connected electrically to an electrical conductor (represented in FIG. 1 by terminals/conductors 25 and 33, and 27 and 35, respectively) that is connected electrically to ground. In a manner well known in the art, one or more of such electrical ground conductors/terminals are preferably incorporated into a different portion of PCB 21 not immediately adjacent thru conductors 26 and 28, such as the backside of PCB 21 or a grounding plane incorporated into the thickness of PCB 21; other locations and configurations for such grounding conductors are contemplated in the present invention. The victim or inner structure of circuit 20 preferably comprises conductors 26 and 28 that are matched-length, differentially-coupled, 18 mil copper microstrips optimized to negate skin effects, and to provide low insertion losses and high return losses for 10 GHz differential signaling.

Outer conductors 22 and 24 represent portions of first and second broadband aggressor signal channels comprising first and second pairs of conductors, respectively. Conductors 22 and 24 carry aggressor signals. Each of conductors 22 and 24 represents one half of the aforementioned conductor pairs because each of conductors 22 and 24 is connected electrically to an electrical conductor (represented in FIG. 1 by terminals/conductors 25 and 33, and 27 and 35, respectively) that is connected electrically to ground. In a manner well known in the art, one or more of such electrical ground conductors are preferably incorporated into a different portion of the PCB not immediately adjacent conductors 22 and 24, such as the backside of the PCB or a grounding plane incorporated into the thickness of the PCB; other locations and configurations for such grounding conductors are contemplated in the present invention. The victim or inner structure of circuit 20 preferably comprises conductors 22 and 24 that are matched-length, single-ended impedance, 18 mil copper microstrips that are optimized for differential 10 GHz transmission.

Inner and outer structures comprising conductors 22, 24, 26 and 28 are preferably designed to balance impedance and coupling requirements while maximizing coplanar inductive and capacitive coupling between aggressor and victim conductors. Maintaining low loss transmission in victim conductors is also an important design consideration. The directions of signals injected in aggressor and victim conductors may be selected according to the particular requirements faced by a user or designer, as may the particular shape of, and spacing between, conductors 22, 24, 26 and 28.

Note that the pairs of electrical conductors referred to hereinabove and below respecting thru differential signal channels and aggressor signal channels include within their scope an electrical conductor connected electrically to ground that serve as a grounding conductor for more than one thru signal channel or more than one aggressor signal channel.

Continuing to refer to FIG. 1, first aggressor signal channel 22 is positioned sufficiently close to at least portions of first thru differential signal channel 26 to cause inductively- or capacitively-coupled crosstalk signals to be induced therein when an aggressor signal of sufficient magnitude or power is injected in first aggressor signal channel 22. Likewise, second aggressor signal channel 24 is positioned sufficiently close to at least portions of second thru differential signal channel 28 to cause inductively- or capacitively-coupled crosstalk signals to be induced therein when an aggressor signal of sufficient magnitude or power is injected in second aggressor signal channel 24. Note that circuit 20 may be configured to operate differentially or in single-ended fashion.

FIG. 1 displays the physical characteristics of one embodiment of circuit 20 constructed in accordance with the teachings of the present invention. For example, all conductors shown in FIG. 1 are 0.018 inches (or "18 mils") in width. Connector ports 1, 2, 3, 4, 5, 6, 7 and 8 are preferably spaced 0.50 inches (or 500 mils") apart. Over NEXT portion 30 of circuit 20, the outer edges of inner victim conductors 26 and 28 are spaced 0.010 inches (or "10 mils") from the inner edges of outer aggressor conductors 22 and 24. As shown in FIG. 1, differential thru signal spacing between the inner edges of inner victim conductors 26 and 28 is 0.015 inches (or "15 mils"). NEXT portion 30 of circuit 20 is about 0.275 inches (or "275 mils") in length, while FEXT portion 40 of circuit 20 is about 0.680 inches (or "680 mils") in length. A representative length of a portion of outer conductor 24 is illustrated in FIG. 1 as being 880 mils.

Connector ports 1, 2, 3, 4, 5, 6, 7 and 8 of circuit 20 may include cable connectors such as SMA or SMP. Such connectors may be employed on inputs or outputs for coupling to test instruments. Additionally, circuit 20 may be integrated into a production PCB trace structure for interference tolerance testing.

Referring to FIG. 1, ports 1, 2, 3 and 4 were employed as inputs when conducting tests of circuit 20. It was discovered that such a configuration provided optimum differential NEXT coupling between aggressor signal channels operating between 1 and 5 GHz at power levels ranging between 0 and 30 dBm, with victim signal channels operating between 1 and 5 GHz at a power level approximating 13 dBm power. Tests conducted on circuit 20 using the foregoing operational parameter yielded the following results:

<−1 dB insertion loss up to 10 GHz

Figure 2:
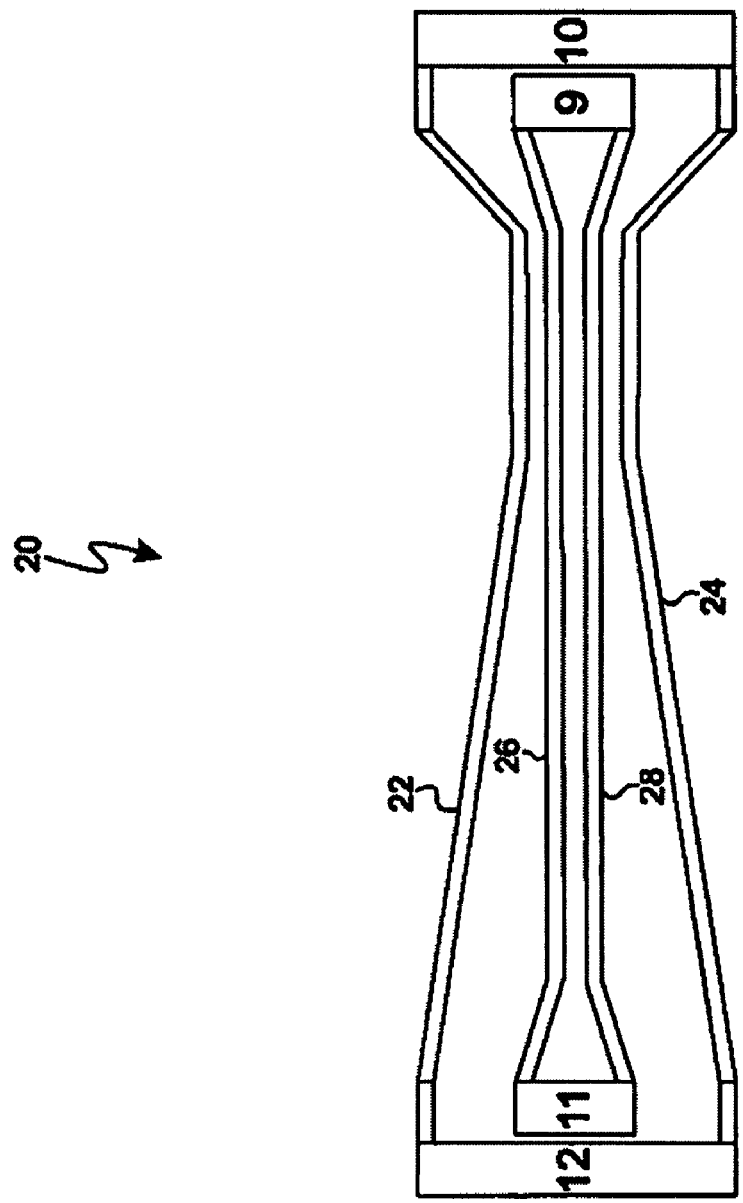
FIG. 2 shows differential crosstalk coupler ports for the circuit of FIG. 1.
Figure 3:
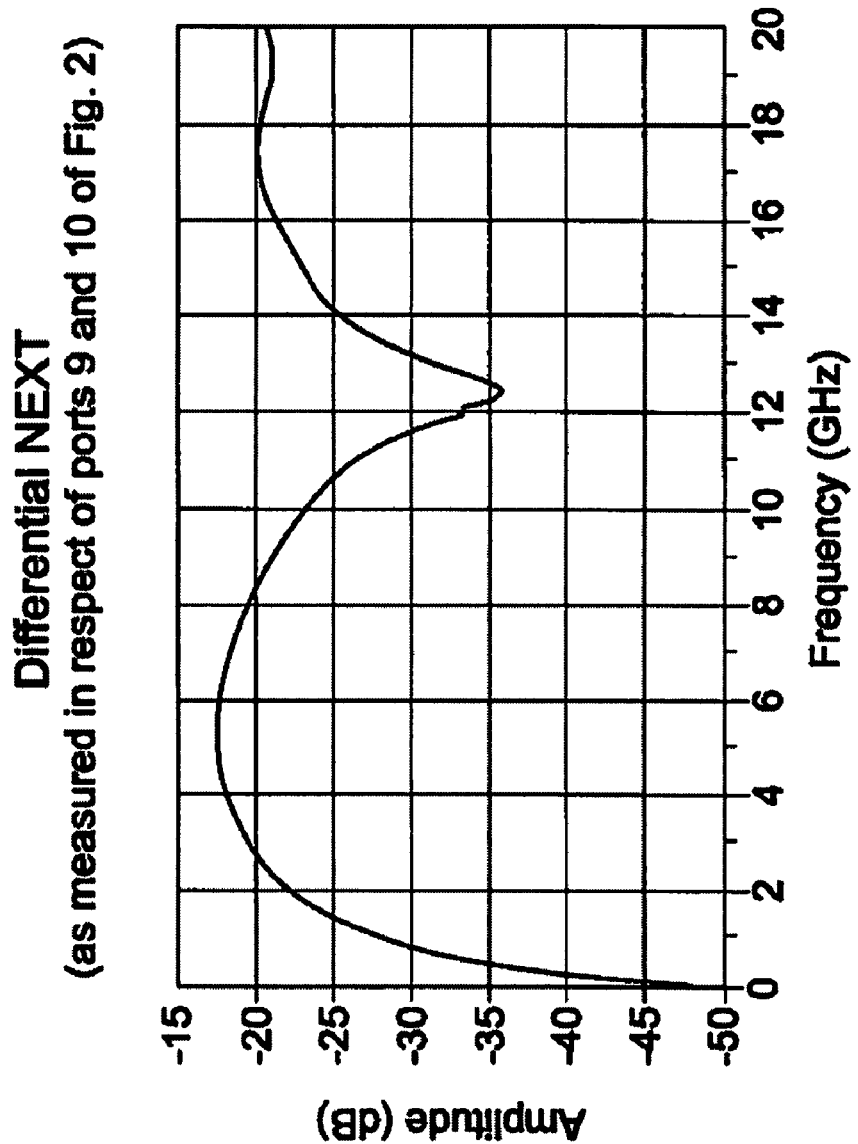
FIG. 3 shows differential NEXT response measured using the circuit of FIG. 1.
Figure 4:
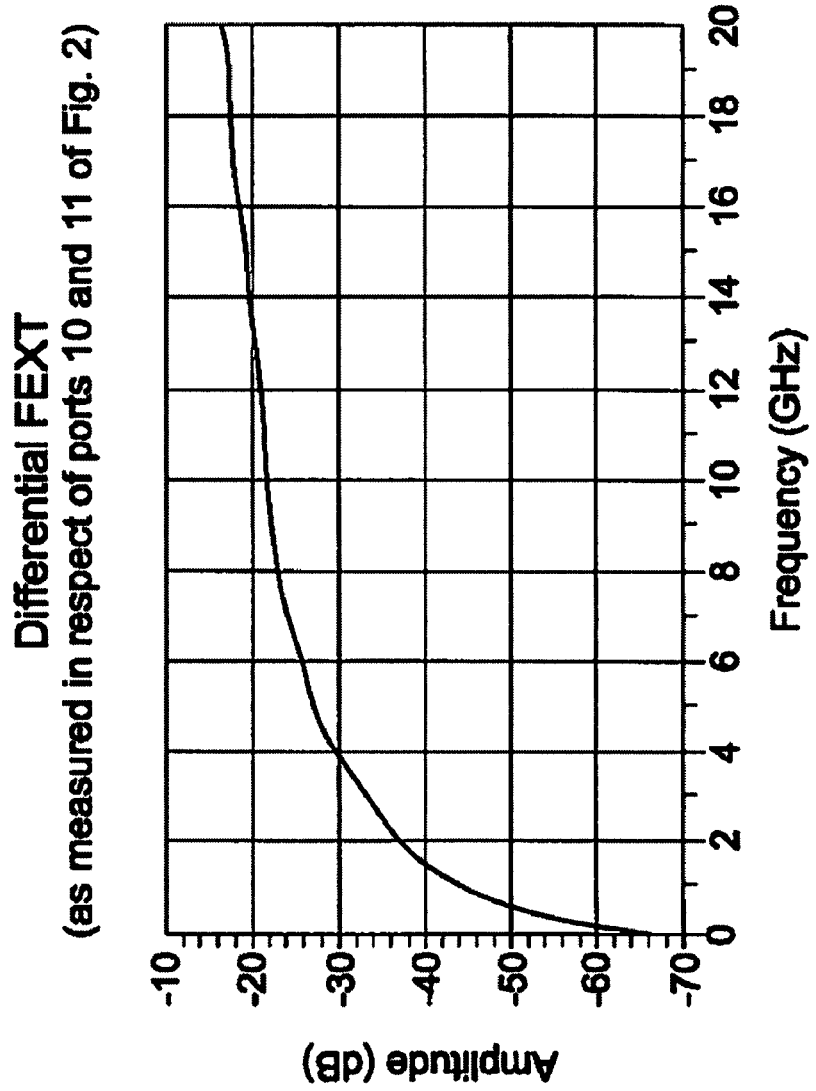
FIG. 4 shows differential FEXT response measured using the circuit of FIG. 1.
Figure 5:
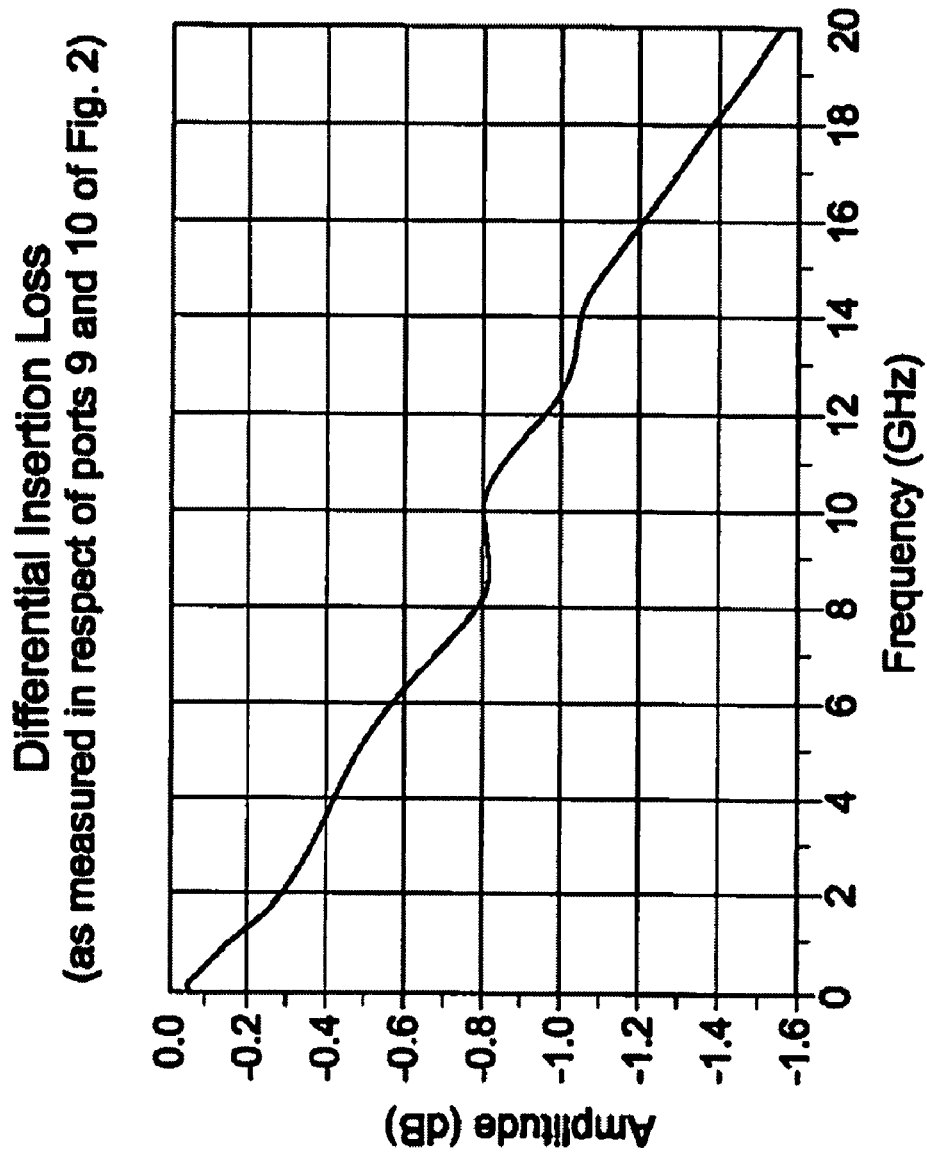
FIG. 5 shows differential insertion loss measured using the circuit of FIG. 1.
Figure 6:
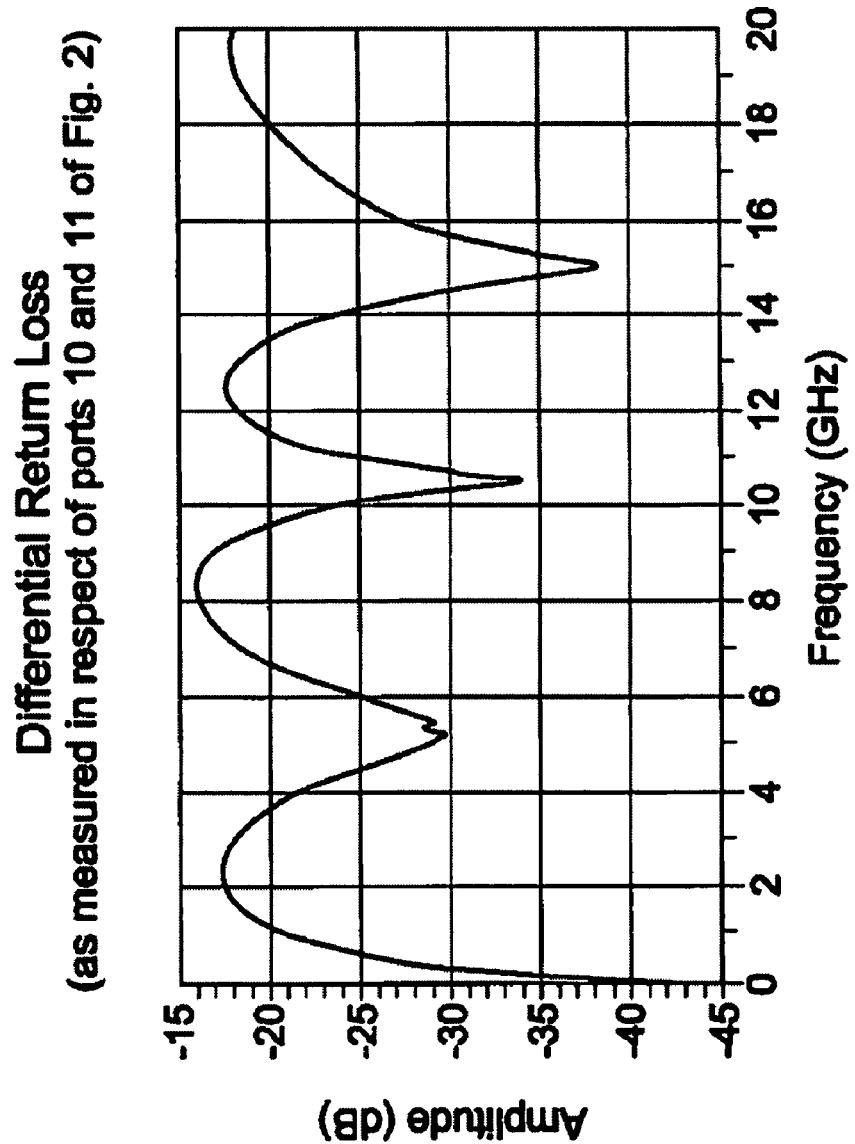
FIG. 6 shows differential return loss measured using the circuit of FIG. 1.

<−15 dB of return loss up to 10GHz 17 dB to 30 dB of coupling from 1-10 GHz in NEXT configuration FIGS. 3 though 6 show further test results obtained using circuit 20 and the above test parameters. FIG. 3 shows differential NEXT results (i.e., Amplitude (in dB) vs. Frequency (in GHz)) measured in circuit 20 using coupler ports 9 and 10 illustrated in FIG. 2. FIG. 4 shows differential FEXT results (i.e. Amplitude (in dB) vs. Frequency (in GHz)) measured in circuit 20 using coupler ports 10 and 11 illustrated in FIG. 2. FIG. 5 shows differential NEXT insertion losses (i.e., Amplitude (in dB) vs. Frequency (in GHz)) measured in circuit 20 using coupler ports 9 and 10 illustrated in FIG. 2, FIG. 6 shows differential FEXT reflection losses (i.e. Amplitude (in dB) vs. Frequency (in GHz)) measured in circuit 20 using coupler ports 10 and 11 illustrated in FIG. 2. Note that FIG. 2 illustrates outer aggressor conductors 22 and 24, inner victim conductors 26 and 28, and differential Xtalk coupler ports 9, 10, 11 and 12.

In preferred embodiments of the present invention, and when measuring NEXT behavior of circuit 20, at least portions of an aggressor channel and its corresponding thru differential signal channel are separated by a distance that permits the acquisition of NEXT data from the thru differential signal channel. Such a distance may range between about 0.002 inches and about 0.020 inches, between about 0.004 inches and about 0.016 inches, between about 0.006 inches and about 0.014 inches, and between about 0.008 inches and about 0.012 inches. Also in preferred embodiments of the present invention, the aggressor channel and its corresponding thru differential channel may be substantially parallel to one another over corresponding lengths ranging between about 0.100 inches and about 0.500 inches.

In preferred embodiments of the present invention, and when measuring FEXT behavior of circuit 20, at least portions of an aggressor channel and its corresponding thru differential signal channel are separated by a distance that permits the acquisition of FEXT data from the thru differential signal channel. Such a distance may range between about 0.002 inches and about 0.020 inches, between about 0.004 inches and about 0.016 inches, between about 0.006 inches and about 0.014 inches, and between about 0.008 inches and about 0.012 inches. Also in preferred embodiments of the present invention, the aggressor channel and its corresponding thru differential channel may be substantially parallel to one another over corresponding lengths ranging between about 0.100 inches and about 0.500 inches.

Test signals injected into circuit 20 and used to produce the data shown in FIGS. 3 through 6 were generated using an Agilent signal generator. Signals measured and received from circuit 20 were measured using an Agilent logic analyzer in combination with a programmable digital computer and Agilent data analysis software. Optionally, a programmable digital computer may be employed to control the signal generator and a logic analyzer to acquire test data automatically.

As will now become apparent, various test circuits and systems for characterizing differential circuits and noise tolerance are described herein. While specific embodiments are disclosed, many variations and alternative embodiments of the present invention may be constructed or implemented without departing from the spirit and scope of the present invention. It is to be understood, therefore, that the scope of the present invention is not limited to the specific embodiments disclosed herein, but that the scope of the present invention is to be determined by looking to the appended claims and their equivalents. As a result, changes and modifications may be made to the particular embodiments of the present invention disclosed herein without departing from the spirit and scope of the present invention as defined in the appended claims.

We claim:

1. A non-transformer circuit for injecting at least one broadband aggressor signal through inductive- or capacitive-coupling means into at least one of first and second thru broadband differential signal channels comprising first and second pairs of conductors, respectively, the circuit comprising:

(a) a first aggressor channel comprising a third pair of conductors, at least portions of the first aggressor channel being positioned sufficiently close to at least portions of the first thru differential signal channel to cause inductively- or capactively-coupled crosstalk signals to be induced therein when the at least one aggressor signal is injected in the first aggressor channel;

(b) a second aggressor channel comprising a fourth pair of conductors, at least portions of the second aggressor channel being positioned sufficiently close to at least portions of the second thru differential signal channel to cause inductively- or capactively-coupled crosstalk signals to be induced therein when the at least one aggressor signal is injected in the second aggressor channel;

wherein at least portions of the first aggressor channel and the first differential signal channel are separated by a first distance that permits the acquisition of near-end cross-talk (NEXT) data from the first thru differential signal channel and the first distance falls within a range selected from the group consisting of between about 0.002 inches and about 0.020 inches, between about 0.004 inches and about 0.016 inches, between about 0.006 inches and about 0.014 inches, and between about 0.008 inches and about 0.012 inches.

2. The circuit of claim 1, wherein the circuit is disposed on a Printed Circuit Board (PCB).

3. The circuit of claim 1, wherein at least portions of the second aggressor channel and the second thru differential signal channel are separated by a fourth distance that permits the acquisition of far-end cross-talk (FEXT) data from the second thru differential signal channel, and wherein the fourth distance falls within a range selected from the group consisting of between about 0.002 inches and about 0.020 inches, between about 0.004 inches and about 0.016 inches, between about 0.006 inches and about 0.014 inches, and between about 0.008 inches and about 0.012 inches.

4. The circuit of claim 3, wherein the second aggressor channel and the second thru differential channel are parallel to one another over those portions separated by the fourth distance for a length ranging between about 0.100 inches and about 0.500 inches.

5. The circuit of claim 4, wherein the first aggressor channel and the first thru differential channel are substantially parallel to one another over those portions separated by the first distance for a length ranging between about 0.100 inches and about 0.500 inches.

6. The circuit of claim 1, wherein at least portions of the second aggressor channel and the second thru differential signal channel are separated by a second distance that permits the acquisition of NEXT data from the second thru differential signal channel, and the second distance falls within a range selected from the group consisting of between about 0.002 inches and about 0.020 inches, between about 0.004 inches and about 0.016 inches, between about 0.006 inches and about 0.014 inches, and between about 0.008 inches and about 0.012 inches.

7. The circuit of claim 6, wherein the second aggressor channel and the second thru differential channel are parallel to one another over those portions separated by the second distance for a length ranging between about 0.100 inches and about 0.500 inches.

8. The circuit of claim 1, wherein at least portions of the first aggressor channel and the first thru differential signal channel are separated by a third distance that permits the acquisition of far-end cross-talk (FEXT) data from the first thru differential signal channel, and wherein the third distance falls within a range selected from the group consisting of between about 0.002 inches and about 0.020 inches, between about 0.004 inches and about 0.016 inches, between about 0.006 inches and about 0.014 inches, and between about 0.008 inches and about 0.012 inches.

9. The circuit of claim 8, wherein the first aggressor channel and the first thru differential channel are parallel to one another over those portions separated by the third distance for a length ranging between about 0.100 inches and about 0.500 inches.

* * * * *